(12) United States Patent
Masleid et al.

(10) Patent No.: US 7,119,580 B2
(45) Date of Patent: *Oct. 10, 2006

(54) REPEATER CIRCUIT WITH HIGH PERFORMANCE REPEATER MODE AND NORMAL REPEATER MODE

(75) Inventors: Robert Paul Masleid, Monte Sereno, CA (US); Vatsal Dholabhai, Portola Valley, CA (US); Steven Thomas Stoiber, Los Altos, CA (US); Gurmeet Singh, Fremont, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/879,879

(22) Filed: Jun. 28, 2004

(65) Prior Publication Data

US 2005/0270070 A1    Dec. 8, 2005

Related U.S. Application Data

(63) Continuation-in-part of application No. 10/864,271, filed on Jun. 8, 2004.

(51) Int. Cl.
  *H03K 19/0175* (2006.01)
(52) U.S. Cl. .............................. 326/86; 326/23; 326/27

(58) Field of Classification Search ................ 326/86, 326/83, 23, 27; 327/112
See application file for complete search history.

(56) References Cited

U.S. PATENT DOCUMENTS

| | | | | |
|---|---|---|---|---|
| 4,498,021 | A | * | 2/1985 | Uya .............................. 326/86 |
| 5,166,555 | A | * | 11/1992 | Kano ........................... 326/87 |
| 5,497,105 | A | | 3/1996 | Oh et al. ....................... 326/27 |
| 5,767,700 | A | * | 6/1998 | Lee ............................... 326/86 |
| 5,969,543 | A | | 10/1999 | Erickson et al. .............. 326/83 |
| 6,025,738 | A | | 2/2000 | Masleid ........................ 326/83 |
| 6,281,706 | B1 | * | 8/2001 | Wert et al. ..................... 326/83 |
| 6,321,282 | B1 | | 11/2001 | Horowitz et al. ............ 710/104 |
| 6,577,176 | B1 | | 6/2003 | Masleid et al. ............. 327/199 |
| 6,731,140 | B1 | | 5/2004 | Masleid et al. ............... 327/99 |
| 2001/0030561 | A1 | | 10/2001 | Asamo et al. .............. 327/170 |
| 2002/0056016 | A1 | | 5/2002 | Horowitz et al. ........... 710/104 |
| 2003/0057775 | A1 | | 3/2003 | Yamashita et al. ............ 307/43 |

* cited by examiner

*Primary Examiner*—Daniel D. Chang

(57) ABSTRACT

Repeater circuit with high performance repeater mode and normal repeater mode is provided and described. In one embodiment, switches are set to a first switch position to operate repeater circuit in the high performance repeater mode. In another embodiment, switches are set to a second switch position to operate the repeater circuit in the normal repeater mode.

20 Claims, 3 Drawing Sheets

REPEATER CIRCUIT WITH HIGH PERFORMANCE REPEATER MODE AND NORMAL REPEATER MODE

CROSS REFERENCE TO RELATED APPLICATIONS

This patent application is a Continuation-in-Part of U.S. patent application Ser. No. 10/864,271 by R. Masleid et al., filed on Jun. 8, 2004, entitled "Stacked Inverter Delay Chain,", assigned to the assignee of the present invention, and hereby incorporated by reference in its entirety.

This patent application is related to U.S. patent application Ser. No. 10/879,645, filed on Jun. 28, 2004, entitled "Repeater Circuit with High Performance Repeater Mode and Normal Repeater Mode, Wherein High Performance Repeater Mode Has Fast Reset Capability", by R. Masleid et al., assigned to the same assignee of the present patent application, and hereby incorporated by reference in its entirety.

This patent application is related to U.S. patent application Ser. No. 10/879,807 by R. Masleid et al., filed on Jun. 28, 2004, entitled "Circuits and Methods for Detecting and Assisting Wire Transitions,", assigned to the assignee of the present invention, and hereby incorporated by reference in its entirety.

This patent application is related to U.S. patent application Ser. No. 10/879,808 by R. Masleid et al., filed on Jun. 28, 2004, entitled "Repeater Circuit Having Different Operating and Reset Voltage Ranges, and Methods Thereof,", assigned to the assignee of the present invention, and hereby inco by reference in its entirety.

BACKGROUND OF THE INVENTION

1. Field of the Invention

The present invention generally relates to repeater circuits. More particularly, the present invention relates to the field of repeater circuits with high performance repeater mode and normal repeater mode.

2. Related Art

In integrated circuit (IC) chip designs, signals (e.g., clock signals, logic signals, power signals, etc.) may propagate along "long" metal wires in comparison to minimum design sizes available in the fabrication process utilized. Propagation delay and distortion are some of the negative effects experienced by the signals propagating along the long metal wires. These negative effects can be minimized by reducing the RC constant of the metal wire. However, in some IC chip designs, the maximum reduction in the RC constant is not sufficient to meet the design specifications. Thus, other techniques are used. One approach involves inserting repeater circuits at periodic intervals along the long metal wires in order to amplify (or remove distortion) the signals as well as to reduce propagation delay (or maintain fast transition times).

SUMMARY OF THE INVENTION

Repeater circuit with high performance repeater mode and normal repeater mode is provided and described. In one embodiment, switches are set to a first switch position to operate the repeater circuit in the high performance repeater mode. In another embodiment, switches are set to a second switch position to operate the repeater circuit in the normal repeater mode.

BRIEF DESCRIPTION OF THE DRAWINGS

The accompanying drawings, which are incorporated in and form a part of this specification, illustrate embodiments of the invention and, together with the description, serve to explain the principles of the present invention.

DETAILED DESCRIPTION OF THE INVENTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details.

In general, repeater circuits can be classified as a high performance repeater circuit or a normal repeater circuit. Other classifications are possible.

During the layout of an IC chip design, repeater circuits are inserted at periodic intervals along long metal wires in order to amplify (or remove distortion) signals as well as to reduce propagation delay (or maintain fast transition times). Typically, there is a wide selection of repeater circuits within each of the two classifications described above. The selection of a repeater circuit may take into account the advantages and disadvantages of the available repeater circuits, as well as the environment in which the repeater circuit will be inserted.

However, once the IC chip design is fabricated, fabrication process variations can impair the operation of the selected repeater circuits in portions of the IC chip. It is possible that another type of repeater circuit would have operated properly despite the fabrication process variations.

Instead of having to choose between a high performance repeater circuit and a normal repeater circuit, the present invention provides a repeater circuit that can selectively operate in a high performance repeater mode or in a normal repeater mode. Thus, the operation mode of the repeater circuit can be selected to provide the best performance after the effects of fabrication process variations are known. In an embodiment of the present invention, the repeater circuit 100 operates in a high performance repeater mode (as shown in FIG. 1) or in a normal repeater mode (as shown in FIG. 2).

Figure 1:
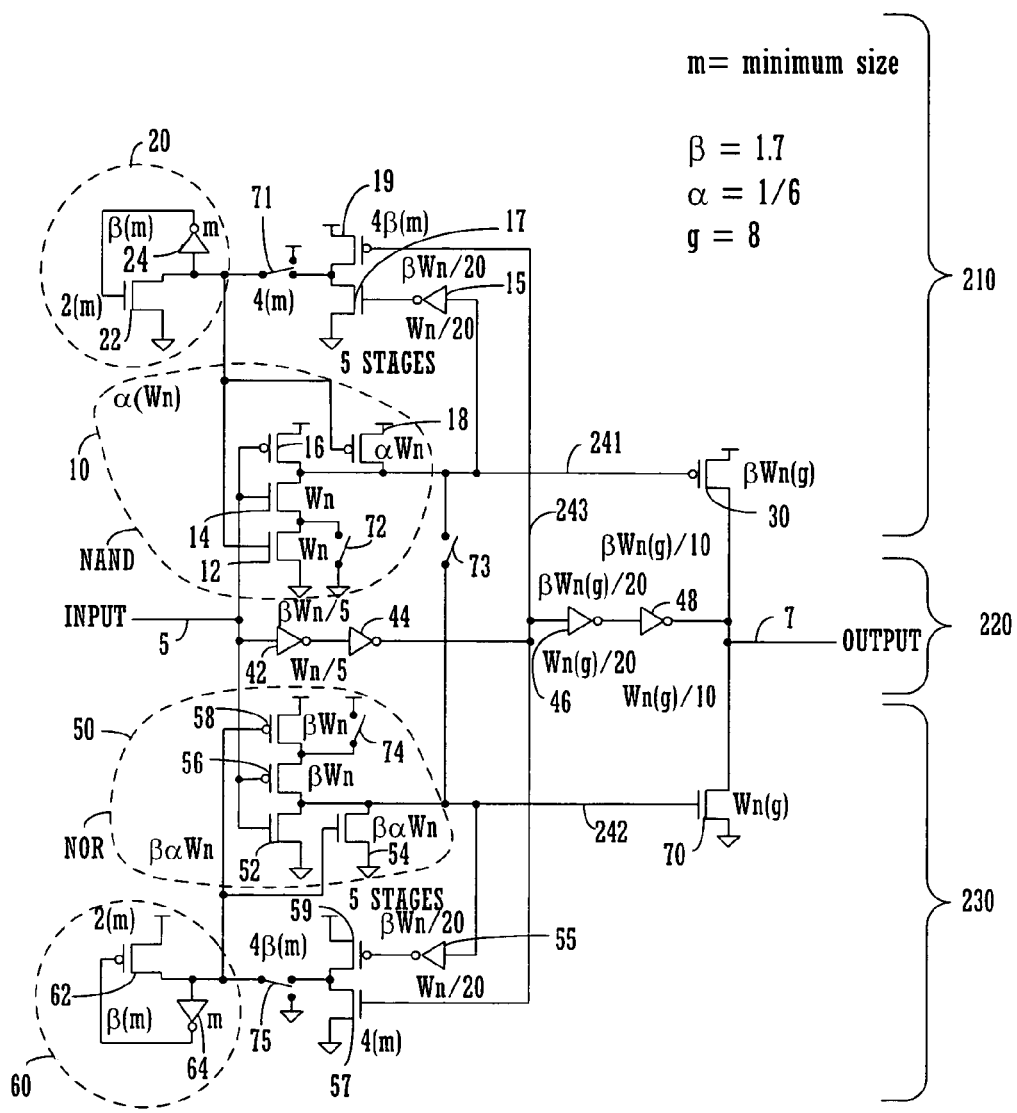
FIG. 1 illustrates a repeater circuit operating in a high performance repeater mode in accordance with an embodiment of the present invention, showing switches in a first switch position.
Figure 2:
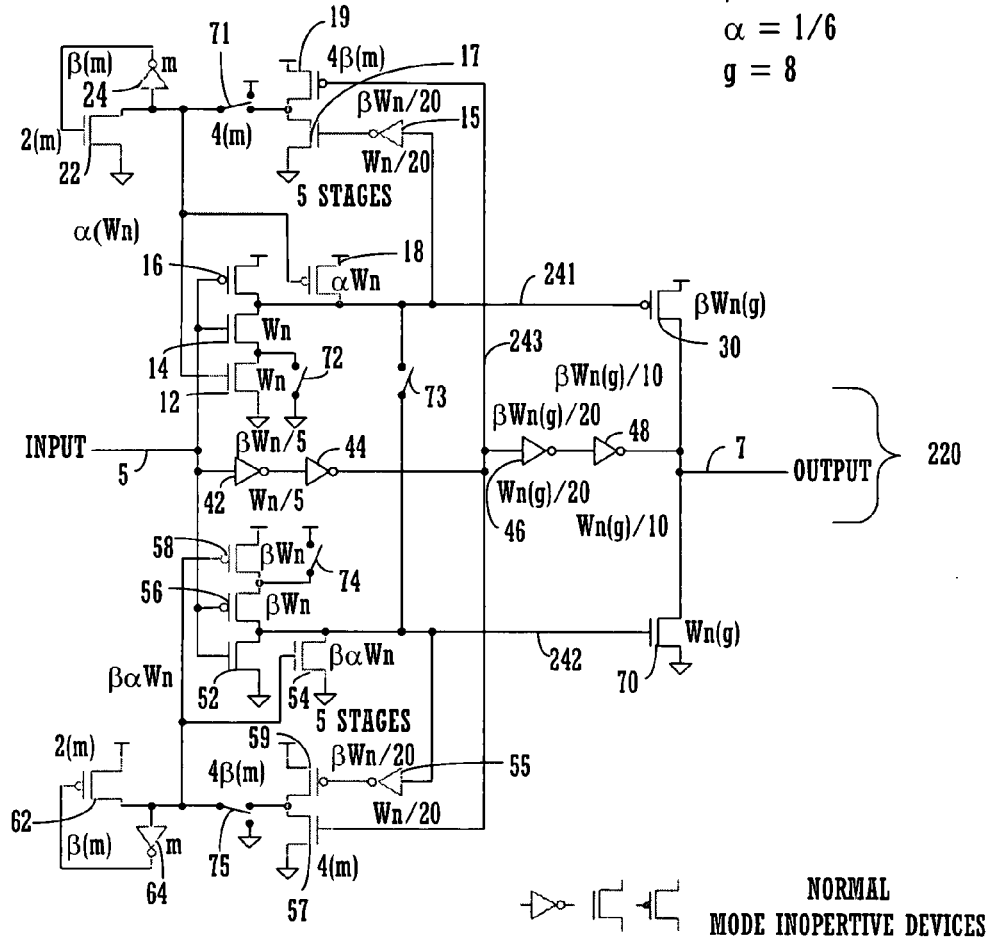
FIG. 2 illustrates a repeater circuit operating in a normal repeater mode in accordance with an embodiment of the present invention, showing switches in a second switch position.
Figure 3:
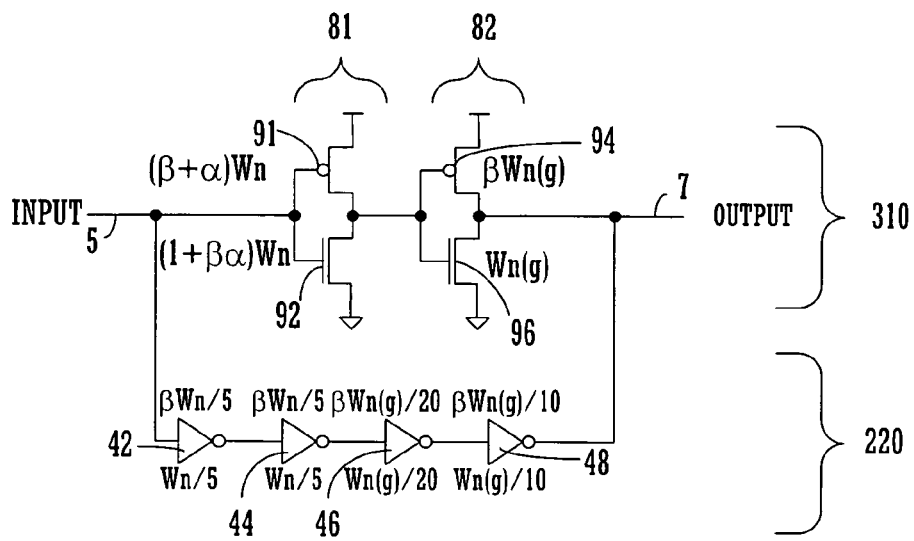
FIG. 3 illustrates the repeater circuit of FIG. 2 with the inoperative components removed in accordance with an embodiment of the present invention.

FIG. 1 illustrates a repeater circuit 100 operating in a high performance repeater mode in accordance with an embodiment of the present invention, showing switches 71–75 in a first switch position. As depicted in FIG. 1, a plurality of switches 71–75 have been inserted at various nodes of the repeater circuit 100. The switches 71–75 can be implemented in any manner (e.g., programmable, static, etc.). When the switches are set at the first switch position illustrated in FIG. 1, the repeater circuit 100 operates in the high performance repeater mode. However, when the switches are set at the second switch position illustrated in FIG. 2, the repeater circuit 100 operates in the normal repeater mode. The transistor sizes given in FIGS. 1, 2, and 3 are exemplary. Other transistor sizes are possible.

Continuing with FIG. 1, the repeater circuit 100 includes an input node 5, a rising edge drive circuit 210, a keeper circuit 220, a falling edge drive circuit 230, and an output node 7.

The rising edge drive circuit 210 has a NAND gate 10 coupled to the input node 5. The NAND gate 10 includes n-type Metal Oxide Field Effect Transistors (or nFET's) 12 and 14 and p-type Metal Oxide Field Effect Transistors (or pFET's) 16 and 18. Additionally, the output node 241 of the NAND gate 10 is coupled to output drive pFET 30. Moreover, the output node 241 of the NAND gate 10 is coupled to an upper delay circuit having a five inverter delay chain 15 and nFET 17. A rising edge reset pFET 19 is coupled to the nFET 17. Further, an upper half latch circuit 20 is coupled to nFET 17, rising edge reset pFET 19, and NAND gate 10. The upper half latch circuit 20 has nFET 22 and inverter 24.

The keeper circuit 220 includes inverters 42, 44, 46, and 48 coupled in series between the input node 5 and the output node 7.

Still referring to FIG. 1, the falling edge drive circuit 230 has a NOR gate 50 coupled to the input node 5. The NOR gate 50 includes n-type Metal Oxide Field Effect Transistors (or nFET's) 52 and 54 and p-type Metal Oxide Field Effect Transistors (or pFET's) 56 and 58. Additionally, the output node 242 of the NOR gate 50 is coupled to output drive nFET 70. Moreover, the output node 242 of the NOR gate 50 is coupled to a lower delay circuit having a five inverter delay chain 55 and pFET 59. A falling edge reset nFET 57 is coupled to the pFET 59. Further, a lower half latch circuit 60 is coupled to pFET 59, falling edge reset nFET 57, and NOR gate 50. The lower half latch circuit 60 has pFET 62 and inverter 64.

Operation of the repeater circuit 100 in response to a falling edge (or transition from logic 1 to logic 0) at the input node 5 is now described. The falling edge at the input node 5 causes the output node 242 of NOR gate 50 to rise, generating the leading edge of a pulse. The rise in output node 242 of NOR gate 50 activates output drive nFET 70, causing output node 7 to fall. Moreover, the falling edge at input node 5 causes the node 243 of the keeper circuit 220 to fall, resetting the rising edge drive circuit 210 by activating the rising edge reset pFET 19.

Moreover, the rise in output node 242 of NOR gate 50 causes the five inverter delay chain 55 to fall, activating pFET 59. The pFET 59 latches the lower half latch circuit 60 to logic high (or 1). Thus, the lower half latch circuit 60 causes the output node 242 of NOR gate 50 to fall, generating the trailing edge of the pulse. The fall in output node 242 of NOR gate 50 deactivates output drive nFET 70. The keeper circuit 220 weakly maintains the output node 7 at logic low (or 0), due to the small size of the transistors of the keeper circuit 220.

Additionally, the fall in output node 242 of NOR gate 50 causes the five inverter delay chain 55 to rise, deactivating pFET 59. Further, the rise in the five inverter delay chain 55 releases the lower half latch circuit 60, terminating the pulse and enabling reset of the falling edge drive circuit 230 during operation of the repeater circuit 100 in response to a rising edge (or transition from logic 0 to logic 1) at the input node 5. Hence, the repeater circuit 100 is ready to respond to the rising edge (or transition from logic 0 to logic 1) at the input node 5.

Operation of the repeater circuit 100 in response to a rising edge (or transition from logic 0 to logic 1) at the input node 5 is now described. The rising edge at the input node 5 causes the output node 241 of NAND gate 10 to fall, generating the leading edge of a pulse. The fall in output node 241 of NAND gate 10 activates output drive pFET 30, causing output node 7 to rise. Moreover, the rising edge at input node 5 causes the node 243 of the keeper circuit 220 to rise, resetting the falling edge drive circuit 230 by activating the falling edge reset nFET 57.

Moreover, the fall in output node 241 of NAND gate 10 causes the five inverter delay chain 15 to rise, activating nFET 17. The nFET 17 latches the upper half latch circuit 20 to logic low (or 0). Thus, the upper half latch circuit 20 causes the output node 241 of NAND gate 10 to rise, generating the trailing edge of the pulse. The rise in output node 241 of NAND gate 10 deactivates output drive pFET 30. The keeper circuit 220 weakly maintains the output node 7 at logic high (or 1), due to the small size of the transistors of the keeper circuit 220.

Additionally, the rise in output node 241 of NAND gate 10 causes the five inverter delay chain 15 to fall, deactivating nFET 17. Further, the fall in the five inverter delay chain 15 releases the upper half latch circuit 20, terminating the pulse and enabling reset of the rising edge drive circuit 210 during operation of the repeater circuit 100 in response to a falling edge (or transition from logic 1 to logic 0) at the input node 5. Hence, the repeater circuit 100 is ready to respond to the falling edge (or transition from logic 1 to logic 0) at the input node 5.

FIG. 2 illustrates a repeater circuit 100 operating in a normal repeater mode in accordance with an embodiment of the present invention, showing switches 71–75 in a second switch position. As depicted in FIG. 2, when the switches 71–75 are set to the second switch position, the repeater circuit 100 operates in a normal repeater mode.

Referring to FIG. 2, switches 71, 72, and 73 are set to the second switch position, disabling several components of the rising edge drive circuit 210. The inoperative components are shown in a lighter color. In particular, nFET 12, pFET 18, the five inverter delay chain 15, nFET 17, rising edge reset pFET 19, nFET 22, and inverter 24 are bypassed or disabled.

Similar, switches 73, 74, and 75 are set to the second switch position, disabling several components of the falling edge drive circuit 230. The inoperative components are shown in a lighter color. In particular, nFET 54, pFET 58, the five inverter delay chain 55, pFET 59, falling edge reset nFET 57, pFET 62, and inverter 64 are bypassed or disabled.

FIG. 3 illustrates the repeater circuit 100 of FIG. 2 with the inoperative components removed in accordance with an embodiment of the present invention. As shown in FIG. 3, in the normal repeater mode, the repeater circuit 100 of FIG. 2 is converted to a double inverter circuit 310 (having inverters 81 and 82) in parallel with a keeper circuit 220 including inverters 42, 44, 46, and 48. The inverter 81 includes nFET 92 (representing nFETs 52 and 14 of FIG. 2) and pFET 91 (representing pFETs 56 and 16 of FIG. 2). The inverter 82 includes nFET 96 (representing nFET 70 of FIG. 2) and pFET 94 (representing pFET 30 of FIG. 2).

In sum, the switches 71, 72, 73, 74, and 75 provide flexibility in operating the repeater circuit 100 in either the high performance repeater mode or the normal repeater mode.

The repeater circuit 100 of FIG. 1 configured into the high performance repeater mode has several advantages over the repeater circuit 100 of FIGS. 2 and 3 configured into the normal repeater mode. First, the high performance repeater mode configuration reduces propagation delay more than the normal repeater mode configuration. Secondly, the high performance repeater mode configuration increases the interval length between repeater circuits compared to the normal repeater mode configuration, reducing the number of repeater circuits needed.

However, the high performance repeater mode configuration has several disadvantages. First, since the pulse generated by either the rising edge drive circuit or falling edge drive circuit has a finite duration, the repeater circuit 100 (FIG. 1) is not immediately available for the opposite edge transition at the input node 5 after the repeater circuit 100 has just completed responding to an edge transition at the input node 5. In particular, release of the half latch circuit (e.g., 20 or 60) to terminate the pulse is required before the repeater circuit 100 is ready for the opposite edge transition even though the repeater circuit 100 has completed driving the output node 7 to the proper logic state (high or low). Secondly, glitches at the input node 5 cause the repeater circuit 100 to respond. This response exaggerates the negative affects of the first disadvantage. Thirdly, the keeper circuit 220 provides reduced protection at the output node 7 against noise coupled to the output node 7 versus a normal repeater configuration.

The normal repeater configuration (FIGS. 2 and 3) does not have these disadvantages. However, the normal repeater configuration (FIGS. 2 and 3) provides less performance compared to the high performance repeater mode configuration. Moreover, the keeper circuit 220 does not significantly affect performance of the double inverter circuit 310, since the transistor sizes of the keeper circuit 220 are relatively small. Moreover, the transistor sizes and transistor ratios of inverters 81 and 82 provide effective performance for normal repeater circuit applications.

Thus, the repeater circuit of the present invention enables use of a high performance repeater mode configuration but allows a fall back configuration that is less aggressive (or complicated) for IC chip design consideration. In effect, the normal repeater mode configuration is a "safe" mode while the high performance repeater mode configuration is an "aggressive" mode.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A repeater circuit comprising:
    an output
    a plurality of transistors; and
    a plurality of switches operative in a first switch position and in a second switch position, wherein said transistors and said switches are coupled to form a plurality of subcircuits, wherein if said switches are in said first switch position said subcircuits are arranged into a high performance repeater mode for generating a pulse at said output in response to an input edge transition, and wherein if said switches are in said second switch position said subcircuits are arranged into a normal repeater mode.

2. The repeater circuit as recited in claim 1 wherein in said high performance repeater mode, said subcircuits include:
    a keeper circuit comprising an input and an output;
    a rising edge drive circuit coupled to said input and said output of said keeper circuit; and
    a falling edge drive circuit coupled to said input and said output of said keeper circuit.

3. The repeater circuit as recited in claim 2 wherein said rising edge drive circuit includes:
    a NAND gate coupled to an input of said repeater circuit;
    an output p-type transistor device coupled to an output of said NAND gate and coupled to an output of said repeater circuit;
    an upper delay circuit coupled to said output of said NAND gate; and
    an upper half latch circuit coupled to said upper delay circuit and said NAND gate.

4. The repeater circuit as recited in claim 2 wherein said falling edge drive circuit includes:
    a NOR gate coupled to an input of said repeater circuit;
    an output n-type transistor device coupled to an output of said NOR gate and coupled to an output of said repeater circuit;
    a lower delay circuit coupled to said output of said NOR gate; and
    a lower half latch circuit coupled to said lower delay circuit and said NOR gate.

5. The repeater circuit as recited in claim 2 wherein said keeper circuit includes:
    a first inverter, a second inverter, a third inverter, and a fourth inverter arranged in series.

6. The repeater circuit as recited in claim 1 wherein in said normal repeater mode, said subcircuits include:
    a double inverter circuit; and
    a keeper circuit arranged in parallel with said double inverter circuit.

7. The repeater circuit as recited in claim 6 wherein said double inverter circuit is formed using particular transistors from a NAND gate of said high performance repeater mode and from a NOR gate of said high performance repeater mode.

8. A repeater circuit comprising:
    a keeper circuit comprising an input and an output;
    a rising edge drive circuit coupled to said input and said output of said keeper circuit and having a first plurality of switches operating in a first switch position; and
    a falling edge drive circuit coupled to said input and said output of said keeper circuit and having a second plurality of switches operating in a first switch position
    wherein if said switches are operated in a second switch position, said rising edge drive and falling edge drive circuits are converted into a double inverter circuit.

9. The repeater circuit as recited in claim 8 wherein said rising edge drive circuit further includes:
    a NAND gate coupled to an input of said repeater circuit;

an output p-type transistor device coupled to an output of said NAND gate and coupled to an output of said repeater circuit;
an upper delay circuit coupled to said output of said NAND gate; and
an upper half latch circuit coupled to said upper delay circuit and said NAND gate.

10. The repeater circuit as recited in claim 8 wherein said falling edge drive circuit further includes:
a NOR gate coupled to an input of said repeater circuit;
an output n-type transistor device coupled to an output of said NOR gate and coupled to an output of said repeater circuit;
a lower delay circuit coupled to said output of said NOR gate; and
a lower half latch circuit coupled to said lower delay circuit and said NOR gate.

11. The repeater circuit as recited in claim 8 wherein said keeper circuit includes:
a first inverter, a second inverter, a third inverter, and a fourth inverter arranged in series.

12. The repeater circuit as recited in claim 8 wherein said double inverter circuit and said keeper circuit are arranged in parallel.

13. The repeater circuit as recited in claim 8 wherein said double inverter circuit is formed using particular transistors from a NOR gate of said falling edge drive circuit and from a NAND gate of said rising edge drive circuit.

14. A method of operating a repeater circuit in multiple modes, said method comprising:
inserting a plurality of switches in said repeater circuit;
if operation in a high performance repeater mode is desired, setting said switches to a first switch position, wherein said high performance repeater mode enables generation of a pulse at an output of said repeater circuit in response to an input edge transition; and
if operation in a normal repeater mode is desired, setting said switches to a second switch position.

15. The method as recited in claim 14 wherein in said high performance repeater mode, said repeater circuit includes:
a keeper circuit comprising an input and an output;
a rising edge drive circuit coupled to said input and said output of said keeper circuit; and
a falling edge drive circuit coupled to said input and said output of said keeper circuit.

16. The method as recited in claim 15 wherein said rising edge drive circuit includes:
a NAND gate coupled to an input of said repeater circuit;
an output p-type transistor device coupled to an output of said NAND gate and coupled to an output of said repeater circuit;
an upper delay circuit coupled to said output of said NAND gate; and
an upper half latch circuit coupled to said upper delay circuit and said NAND gate.

17. The method as recited in claim 15 wherein said falling edge drive circuit includes:
a NOR gate coupled to an input of said repeater circuit;
an output n-type transistor device coupled to an output of said NOR gate and coupled to an output of said repeater circuit;
a lower delay circuit coupled to said output of said NOR gate; and
a lower half latch circuit coupled to said lower delay circuit and said NOR gate.

18. The method as recited in claim 15 wherein said keeper circuit includes:
a first inverter, a second inverter, a third inverter, and a fourth inverter arranged in series.

19. The method as recited in claim 14 wherein in said normal repeater mode, said repeater circuit includes:
a double inverter circuit; and
a keeper circuit arranged in parallel with said double inverter circuit.

20. The method as recited in claim 19 wherein said double inverter circuit is formed using particular transistors from a NAND gate of said high performance repeater mode and from a NOR gate of said high performance repeater mode.

* * * * *